United States Patent
Shibahara et al.

(10) Patent No.: US 6,479,314 B2
(45) Date of Patent: Nov. 12, 2002

(54) METHOD OF PRODUCING VACUUM CONTAINER

(75) Inventors: Teruhisa Shibahara, Kanazawa (JP); Tetsuzo Hara, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/948,302

(22) Filed: Sep. 6, 2001

(65) Prior Publication Data

US 2002/0072143 A1 Jun. 13, 2002

(30) Foreign Application Priority Data

Sep. 8, 2000  (JP) ....................... 2000-273312

(51) Int. Cl.$^7$ ............... H01L 21/00; H01L 21/44; H01L 21/48; H01L 21/50
(52) U.S. Cl. ............... 438/51; 438/115; 438/126; 438/127; 438/55
(58) Field of Search ............... 438/26, 51, 55, 438/64, 67, 115, 125, 126, 127; 156/382; 73/514.36

(56) References Cited

U.S. PATENT DOCUMENTS 5,673,476 A * 10/1997 Akaike et al. ............ 29/825
6,082,197 A * 4/2000 Mizuno et al. ............ 73/514.36

FOREIGN PATENT DOCUMENTS

| JP | 405203519 A | * | 8/1993 |
| JP | 411281668 A | * | 10/1999 |

* cited by examiner

Primary Examiner—John F. Niebling
Assistant Examiner—Viktor Simkovic
(74) Attorney, Agent, or Firm—Ostrolenk, Faber, Gerb & Soffen, LLP

(57) ABSTRACT

A semiconductor substrate is coupled to the upper side of a base. After the semiconductor substrate is processed, a lid material is anode-coupled to the semiconductor substrate. For the anode-coupling, first, the semiconductor substrate and the lid material are anode-coupled in a spot pattern. After this, the semiconductor substrate and the lid material are wholly anode-coupled to each other. Thereafter, the laminate including the base, the semiconductor substrate, and the lid material are divided and separated into predetermined individual areas. Thus, a vacuum container having a vacuum cavity formed inside of the laminate including the base layer, the semiconductor layer, and the lid layer can be formed. The vacuum degree of the vacuum cavity of the vacuum container is considerably enhanced compared to that by a conventional process of producing a vacuum container. In addition, scattering of the vacuum degrees of the vacuum cavities can be suppressed.

2 Claims, 4 Drawing Sheets

METHOD OF PRODUCING VACUUM CONTAINER

BACKGROUND OF THE INVENTION

1. Field of the Invention

The present invention relates to a method of producing a vacuum container by using anode-coupling.

2. Description of the Related Art

FIG. 3 shows an example of a vacuum container schematically in cross-section. The vacuum container 1 shown in FIG. 3 comprises a base layer (e.g., glass layer) 2, a semiconductor layer (e.g., silicon layer) 3, and a lid layer (e.g., glass layer) 4. The base layer 2, the semiconductor layer 3, and the lid layer 4 are laminated and integrated sequentially in that order to produce a laminate 5. Concavities 2a and 4a are formed in the base layer 2 and the lid layer 4 in the positions thereof opposed to each other through the semiconductor layer 3. These concavities 2a and 4a form a vacuum cavity 6 inside the laminate 5.

A vibrator 7, for example, obtained by processing the semiconductor substrate constituting the semiconductor layers 3 is received in the vacuum cavity 6. The vibrator 7, received and disposed in the vacuum cavity 6, can be satisfactorily vibrated without suffering no damping by air.

FIG. 4 is a perspective view showing an example of the semiconductor layer 3, together with the base layer 2. The semiconductor layer 3 has a vibrator formed by processing the semiconductor substrate. The semiconductor layer 3 shown in FIG. 4 is formed by using a technique such as etching or the like. A sensor unit 8 containing the vibrator 7, and a sealing portion 9 surrounding the sensor unit 8 are formed in the semiconductor layer 3. The sealing portion 9 is sandwiched between the base layer 2 and the lid layer 4 from the upper and lower sides thereof shown in FIG. 4, respectively. The sealing portion is anode-coupled to the base layer 2 and the lid layer, respectively. Thus, the sealing portion 9 air-tightly seals the vacuum cavity 6 for containing the sensor unit 8.

The sensor unit 8 shown in FIG. 4, which constitutes an angular velocity sensor, comprises the quadrangular vibrator 7, vibrator supporting fixing portions 10 (10a, 10b, 10c, and 10d), electrode supporting-fixing portions 11 (11a and 11b), a detection electrode pad forming portion 12, beams 13 (13a, 13b, 13c, and 13d), interdigital movable electrodes 14 (14a and 14b), and interdigital fixed electrodes 15 (15a and 15b).

The vibrator supporting fixing portions 10 (10a, 10b, 10c, and 10d), the electrode supporting-fixing portions 11 (11a and 11b), and the detection electrode pad forming portion 12 are anode-coupled and fixed to the base layer 2 and the lid layer 4. The vibrator 7 is connected to and is communicated with the vibrator supporting fixing portions 10 (10a, 10b, 10c, and 10d) via the beams 13 (13a, 13b, 13c, and 13d), respectively. Moreover, the interdigital movable electrodes 14 (14a and 14b) are formed so as to protrude from the ends of the vibrator 7 in the X-direction in FIG. 4. The interdigital fixed electrodes 15 (15a and 15b) are formed so as to extend from the electrode supporting-fixing portions 11 (11a and 11b) in the X-direction in such a manner as to mesh with the interdigital movable electrodes 14 at an interval from the interdigital movable electrodes 14.

The concavities 2a and 4a, shown in FIG. 3, are formed in the base layer 2 and the lid layer 4 in the positions thereof which are opposed to the area of the semiconductor layer 3 in which the vibrator 7, the beams 13 (13a, 13b, 13c, and 13d), and the interdigital movable electrodes 14 (14a and 14b) are formed. In the concavities 2a and 2b, the vibrator 7, the beams 13 (13a, 13b, 13c, and 13d), and the interdigital movable electrodes 14 (14a and 14b) are movably lifted from the base layer 2 and the lid layer 4.

Electrode pads (not shown), which are metal films, are formed on the upper faces of the vibrator supporting fixing portions 10 (10a, 10b, 10c, and 10d), the electrode supporting-fixing portions 11 (11a and 11b), and the detection electrode pad forming portion 12, respectively. Perforations are formed in the lid layer 4 in the positions thereof opposed to the electrode pads, respectively. Thus, the electrode pads are exposed to the exterior, and can be electrically connected to an external circuit by wire-bonding or the like.

A detection electrode (not shown) is formed on the bottom of the concavity 2a of the base layer 2 in the position thereof opposed to the vibrator 7 at an interval therefrom. Moreover, a wiring pattern 16 for connecting the detection electrode and the detection electrode pad forming portion 12 to each other is formed on the base layer 2.

Referring to the sensor unit 8 shown in FIG. 4, when an AC current for driving is applied from the external circuit to the fixed electrodes 15a and 15b, for example, the electrostatic forces between the fixed electrode 15a and the movable electrode 14a and that between the fixed electrode 15b and the movable electrode 14b are changed depending on the above-mentioned AC voltage, so that the vibrator 7 is driven and vibrated in the X-direction shown in FIG. 4. If the vibrator 7 is rotated on the Y-axis while it is being driven and vibrated as described above, a Coriolis force is generated in the Z-direction. The Coriolis force is added to the vibrator 7, so that the vibrator 7 is vibrated in the Z-direction to be detected.

The vibration of the vibrator 7 in the Z-direction changes the interval between the vibrator 7 and the detection electrode to change, so that the electrostatic capacity between the vibrator 7 and the detection electrode is changed. The change in the electrostatic capacity is output from the detection electrode to the exterior via the wiring pattern 16 and the electrode pad. The angular velocity or the like of the rotation of the vibrator 7 on the Y-axis can be determined based on the detected value.

Referring to a process of producing the vacuum container 1 containing the vibrator 7 (sensor unit 8) shown in FIG. 4, for example, a base for forming a plurality of the base layers 2, a semiconductor substrate for forming a plurality of the semiconductor layers 3, and a lid material for forming a plurality of the lid layers 4 are sequentially laminated and integrated to produce a laminate. The laminate is divided into the areas for forming the vacuum containers, which are separated into the individual vacuum containers. Hereinafter, an example of the process of producing the vacuum container 1 will be described in detail with reference to FIGS. 5A to 5F. FIGS. 5A to 5F show the site corresponding to the part of the vacuum container taken along line A—A in FIG. 4, respectively.

First, a base 20 for forming a plurality of the base layers 2 is prepared as shown in FIG. 5A. The concavities 2a are formed in the predetermined areas of the base 20 for forming the respective base layers 2. The detection electrode and the wiring pattern 16 are formed on the inner wall of each concavity 2a by a technique such as sputtering or the like. Then, a semiconductor substrate 21 is placed on the upper side of the base 20 in such a manner as to close the openings of the concavities 2a, as shown in FIG. 5B. The base 20 and the semiconductor substrate 21 are anode-coupled to each other. Then, the semiconductor substrate 21 is surface-ground till a predetermined thickness. Thereafter, the upper side of the semiconductor substrate 21 is polished to have a mirror-like surface as shown in FIG. 5C.

After this, the semiconductor substrate 21 is processed by using such a technique as etching, photolithography, or the like, as shown in FIG. 5D. The semiconductor substrate 21 is processed to form the semiconductor layers 3 of a plurality of the vacuum containers 1. In particular, by processing the semiconductor substrate 21, the patterns shown in FIG. 4 are formed in the areas of the semiconductor substrate 21 for forming the semiconductor layers, respectively. Electrode pads are formed on the upper side of the semiconductor substrate 21 by a thin-film formation technique such as sputtering or the like.

Thereafter, a lid material 22 is placed on the upper side of the semiconductor substrate 21 in a vacuum chamber where vacuum-exhausting is being carried out as shown in FIG. 5E. The lid material 22 is processed to form the lid layers 4 of the plurality of the vacuum containers. Previously, the concavities 4a and a plurality of the perforations (not shown) are formed in the areas of the lid material 22 for forming the lid layers, respectively. Referring to the above-described placement of the lid material 22 on the upper side of the semiconductor substrate 21, the lid material 22 is positioned in such a manner that the concavities 4a are opposed to the corresponding vibrators 7 at an interval, and moreover, the positions of the plurality of the perforations coincide with those of the electrode pads formed on the vibrator supporting fixing portions 10 (10a, 10b, 10c, and 10d), the electrode supporting-fixing portions 11 (11a and 11b), and the detection electrode pad forming portion 12, respectively. Thus, the lid material 22 is placed on the upper side of the semiconductor substrate 21.

Succeedingly, an electrode plate 24 electrically connected to voltage-applying means 25 is mounted onto the upper side of the lid material 22, and the semiconductor substrate 21 is electrically connected to the voltage-applying means 25 in the above-mentioned vacuum chamber. After this, high voltage for anode-coupling is applied between the semiconductor substrate 21 and the electrode plate 24 to anode-couple the lid material 22 and the semiconductor substrate 21 to each other. Thus, the laminate in which the base 20, the semiconductor substrate 21, and the lid material 22 are laminated and integrated is formed as shown in FIG. 5F. The vacuum cavities 6 containing the vibrators 7 are formed and air-tightly sealed in the vacuum container formation areas of the laminate, respectively.

After this, the laminate comprising the base 20, the semiconductor substrate 21, and the lid material 22 are cut along predetermined dicing lines to be divided and separated into the individual vacuum containers. Thus, the vacuum container 1 can be produced in the above-described manner.

However, when the lid material 22 is anode-coupled to the upper side of the semiconductor substrate 21 according to the above-described process of producing the vacuum container 1, undesirable gas is evolved in the portions of the semiconductor substrate 21 and the lid material 22 which are anode-coupled to each other. The gas flows into the vacuum cavity 6. Thus, the vacuum cavity 6 is air-tightly sealed while the flown undesirable gas remains in the vacuum cavity 6. Therefore, problematically, a desirable vacuum condition in the vacuum cavity 6 can be obtained with difficulty, due to the undesirable gas.

Moreover, the evolution amount of the undesirable gas varies, so that the vacuum degrees of the vacuum cavities 6 become different from each other depending on the vacuum containers 1. Accordingly, when the vibrators 7 constituting the angular velocity sensors shown in FIG. 4 are contained in the vacuum cavities 6 of the vacuum containers 1, for example, the vibration states of the vibrators 7 become different from each other depending on the vacuum containers 1. Accordingly, the performances of the angular velocity sensors become different from each other, and so forth. Thus, a problem arises in that the qualities of products are scattered.

To solve these problems, a technique for preventing deterioration of the vacuum degree of the vacuum cavity 6 and scattering of the vacuum degree, by which a gas adsorptive substance, in addition to the vibrator 7, is contained in the vacuum cavity 6 to adsorb the undesirable gas, has been proposed. However, the gas adsorptive substance needs to be placed in each of the vacuum cavities 6. A problem arises in that it is troublesome and takes much time to carry out the technique. Moreover, the vacuum cavities 6 are required to be enlarged in order to contain the gas adsorptive substance. Thus, inevitably, a problem occurs in that the sizes of the vacuum containers 1 are increased.

SUMMARY OF THE INVENTION

To solve the above-described problems, the present invention has been devised. It is an object of the present invention to provide a method of producing a vacuum container in which the vacuum cavity can be easily controlled so as to have a desirable vacuum state, and which is small in size.

To achieve the above-described object, according to the present invention, there is provided a method of producing a vacuum container which has a vacuum cavity formed inside a laminate including a base layer, a semiconductor layer, and a lid layer which comprises the steps: coupling a semiconductor substrate to the upper side of a base; anode-coupling a lid material to the upper side of the semiconductor substrate to form a laminate; and dividing and separating the laminate into predetermined individual areas; the lid material being placed on the upper side of the semiconductor substrate after the semiconductor substrate is coupled to the base, the semiconductor substrate and the lid material being anode-coupled to each other in a spot pattern, and succeedingly, the semiconductor substrate and the lid material being entirely anode-coupled to each other.

Preferably, the body of the base and the semiconductor substrate coupled to each other and the lid material are arranged in the atmosphere, the semiconductor substrate and the lid material are anode-coupled to each other in a spot pattern, and succeedingly, the semiconductor substrate and the lid material are entirely anode-coupled to each other in a vacuum in which vacuum-exhausting is carried out.

As described above, after the semiconductor substrate and the lid material are anode-coupled to each other in a spot pattern, the semiconductor substrate and the lid material are entirely anode-coupled to each other. By anode-coupling the semiconductor substrate and the lid material in plural steps, the vacuum degree of the vacuum cavity of the vacuum container can be desirably enhanced compared to that obtained by entirely anode-coupling the semiconductor substrate to the lid material at one time as conventionally carried out.

DESCRIPTION OF THE PREFERRED EMBODIMENTS

Figure 1A:
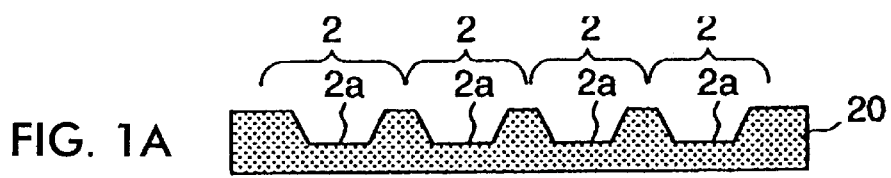
FIG. 1 illustrates processes of forming a vacuum container according to embodiments of the present invention.

Hereinafter, embodiments of the present invention will be described with respect to the drawings.

Referring to a first embodiment, a process of producing a vacuum container having the vibrator 7 (sensor unit 8) shown in FIG. 4 contained and sealed therein will be described by way of an example. In the description of the first embodiment, similar parts in the first embodiment and the above-described conventional example are designated by the same reference numerals, and the repeated description of the similar parts is omitted.

Especially, the first embodiment is different from the above-described conventional example in that when the lid material 22 is anode-coupled to the upper side of the semiconductor substrate 21, first, the semiconductor substrate 21 and the lid material 22 are anode-coupled to each other in a spot pattern, and thereafter, the semiconductor substrate 21 and the lid material 22 are wholly anode-coupled to each other. In other respects, the process of producing the vacuum container of the first embodiment is similar to that of the conventional example.

In particular, in the first embodiment, the concavities 2a are formed by sand blast working in the areas of the base (e.g., glass substrate) 20 for forming the respective base layers 2. The detection electrodes and the wiring patterns are formed on the inner walls of the concavities 2a by a film-forming technique such as sputtering or the like as shown in FIG. 1A.

Figure 1B:
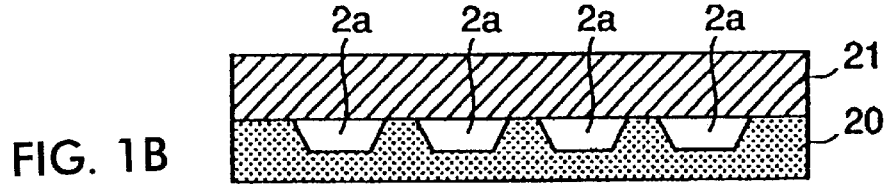
Figure 1C:
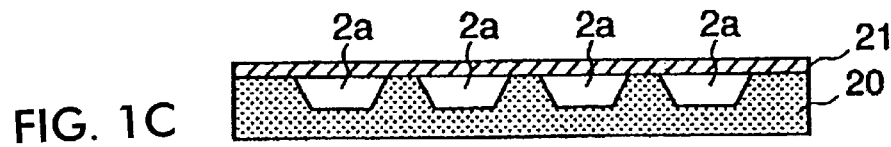
Figure 1D:
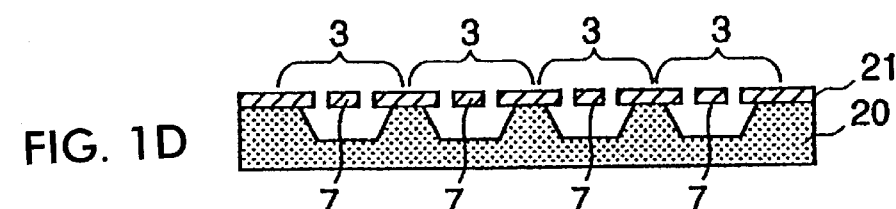

Next, the semiconductor substrate (e.g., silicon substrate) 21 is anode-coupled to the upper side of the base 20, as shown in FIG. 1B. Then, the semiconductor substrate 21 is surface-ground to be thinned till a predetermined thickness as shown in FIG. 1C. Thereafter, the surface of the thinned semiconductor substrate 21 is polished to be mirror-like finished. After this, the semiconductor substrate 21 is processed by a technique such as etching, photolithography, or the like, as shown in FIG. 1D, so that patterns shown in FIG. 4 are formed in the areas of the semiconductor substrate 21 for forming the semiconductor layers 3, respectively. Then, the electrode pads are formed on the upper side of the semiconductor substrate 21 by a film-forming technique.

Figure 1E:
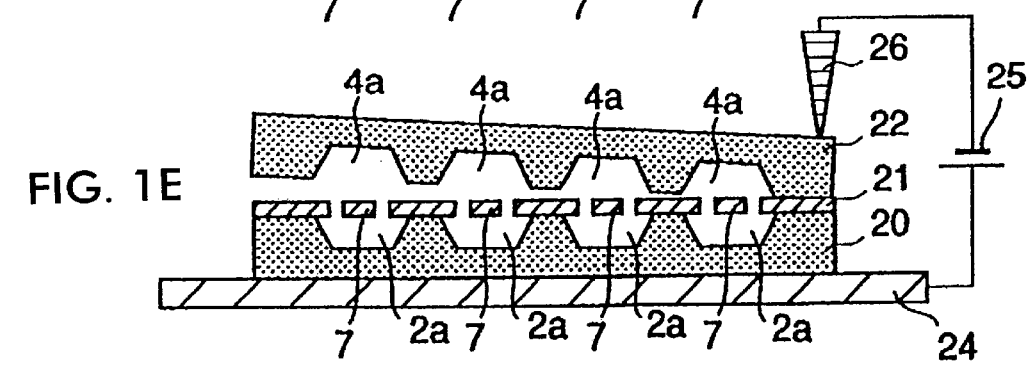

Thereafter, the body of the base 20 and the semiconductor substrate 21 coupled to each other is placed on the electrode plate 24 while the base 20 is positioned on the lower side of the body, as shown in FIG. 1E, and moreover, the lid material (e.g., glass substrate) 22 is placed on the upper side of the semiconductor substrate 21 in a vacuum chamber under vacuum-exhausting. Previously, the concavities 4a are formed in the areas of the lid material 22 for forming the lid layers 4 by sand blast working, respectively. Moreover, previously, a plurality of perforations (not shown) for exposing the electrode pads are formed, respectively. Referring to the placement of the lid material 22 on the upper side of the semiconductor substrate 21, positioning of the concavities 4a and the plurality of the perforations is carried out, and the lid material 22 is placed on the upper side of the semiconductor substrate 21, as carried out in the conventional example.

An electrode pin 26 electrically connected to the voltage-applying means 25 is placed at a predetermined position on the upper side of the lid material 22 (in the first embodiment, the end of the lid material 22). A high voltage for anode-coupling is applied between the electrode plate 24 and the electrode pin 26 by the voltage applying means 25, so that the semiconductor substrate 21 and the lid material 22 are anode-coupled to each other in a spot pattern. In this case, the high voltage for anode-coupling and the voltage applying time are determined experimentally and by operation to be set in such a manner that at the time when the anode-coupling in the spot pattern is completed, none of the cavities 6 are air-tightly sealed, and the gas in the spaces 6 can be led out to the exterior.

Figure 1F:
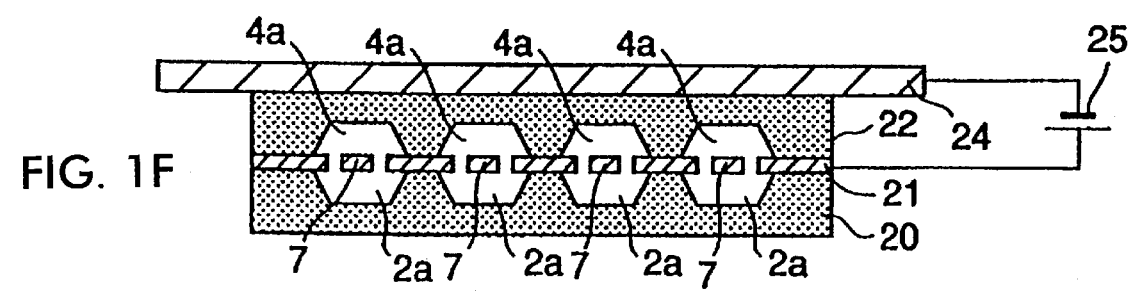

After this, the electrode plate 24 is placed on the upper side of the lid material 22 in the vacuum environment as shown in FIG. 1F, and the semiconductor substrate 21 is electrically connected to the voltage applying means 25. A high voltage for anode-coupling is applied between the semiconductor substrate 21 and the electrode 24 by the voltage-applying means 25, so that the semiconductor substrate 21 and the lid material 22 are wholly anode-coupled to each other. In this case, the high voltage for wholly anode-coupling and the voltage-applying time are determined experimentally and by operation to be set so that the semiconductor substrate 21 and the lid material 22 can be anode-coupled to each other wholly and securely.

Figure 1G:
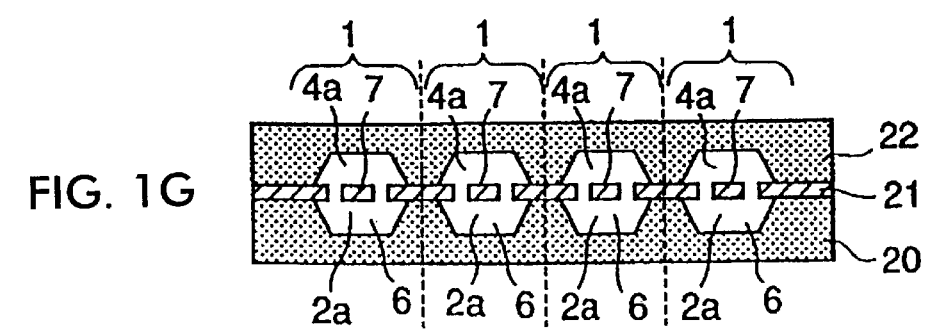

A laminate comprising the base 20, the semiconductor substrate 21 and the lid material 22 shown in FIG. 1G is formed by wholly anode-coupling the semiconductor substrate 21 and the lid material 22 as described above. Thus, the vacuum cavities 6 containing the vibrators 7 are air-tightly sealed in the areas of the laminate for forming the vacuum containers, respectively. After this, similarly to the conventional example, the laminate is cut along predetermined dicing lines to be divided and separated into the individual vacuum containers. Thus, the vacuum container 1 can be produced.

According to the first embodiment, the semiconductor substrate 21 is coupled to the base 20, and thereafter, the lid material 22 is anode-coupled to the upper side of the semiconductor substrate 21. In this case, first, the semiconductor substrate 21 and the lid material 22 are anode-coupled to each other in a spot pattern. After this, the semiconductor substrate 21 and the lid material 22 are wholly anode-coupled to each other. The vacuum degree of the vacuum cavity 6 in the vacuum container can be considerably enhanced compared to that of the conventional example, by anode-coupling the semiconductor plate 21 and the lid material 22 as described above. This has been identified by the experiment made by the inventors of the present invention.

Figure 4:
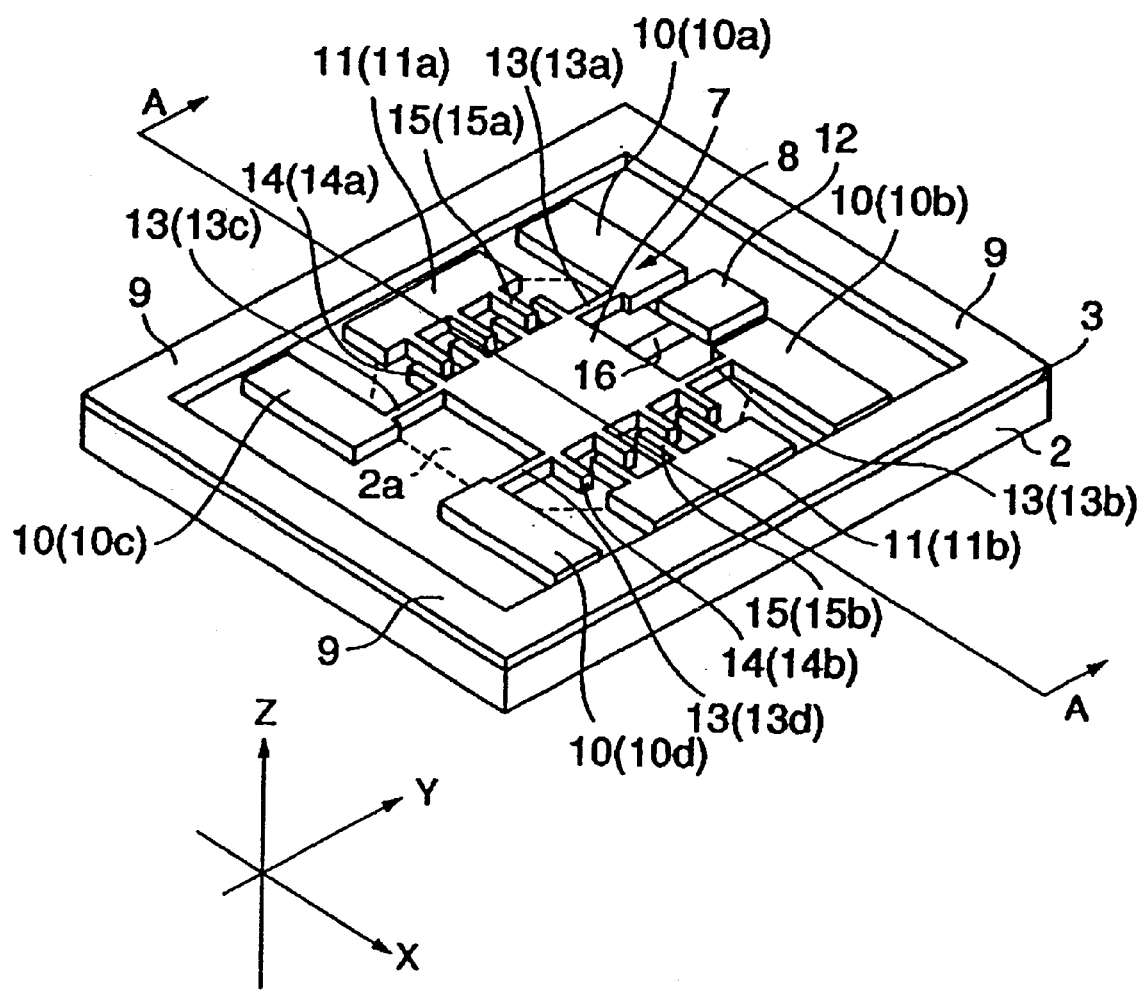
FIG. 4 illustrates an example of a vibrator contained in the vacuum container.
Figure 5A:
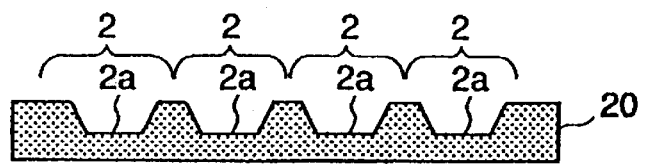
FIG. 5 illustrates an example of a conventional process of producing a vacuum container.
Figure 5B:
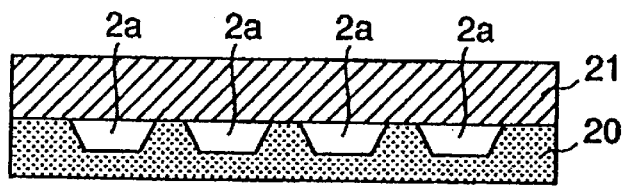
Figure 5C:
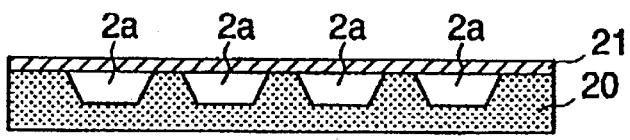
Figure 5D:
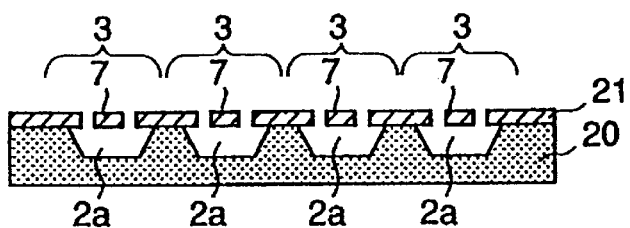
Figure 5E:
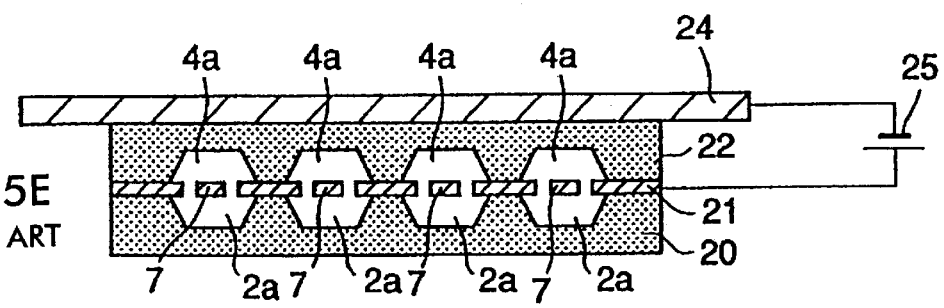
Figure 5F:
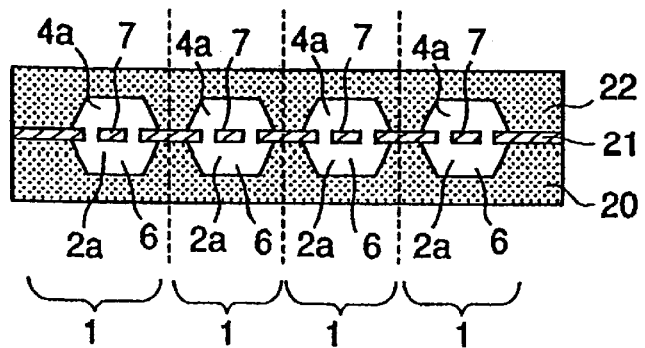

Referring to the experiment, by the production process according to the above-described embodiment, a plurality of the vacuum containers 1 containing the vibrators 7 shown in FIG. 4 were produced. On the other hand, a plurality of the vacuum containers 1 having the same shape and size as the above-described vacuum containers were produced by the conventional production process. The vacuum condition of the vacuum cavities 6 of the vacuum containers 1 thus produced was examined. The vacuum condition of the vacuum cavity 6 can be estimated by determining the Q value with respect to resonance of the vibrator 7. Accordingly, the inventors determined the Q values for the resonance of the vibrators 7 of the vacuum resonators 1 produced as described above. The produced vacuum containers 1 were grouped based on the Q values. A higher Q value means a higher vacuum degree of the vacuum cavity 6.

Figure 2:
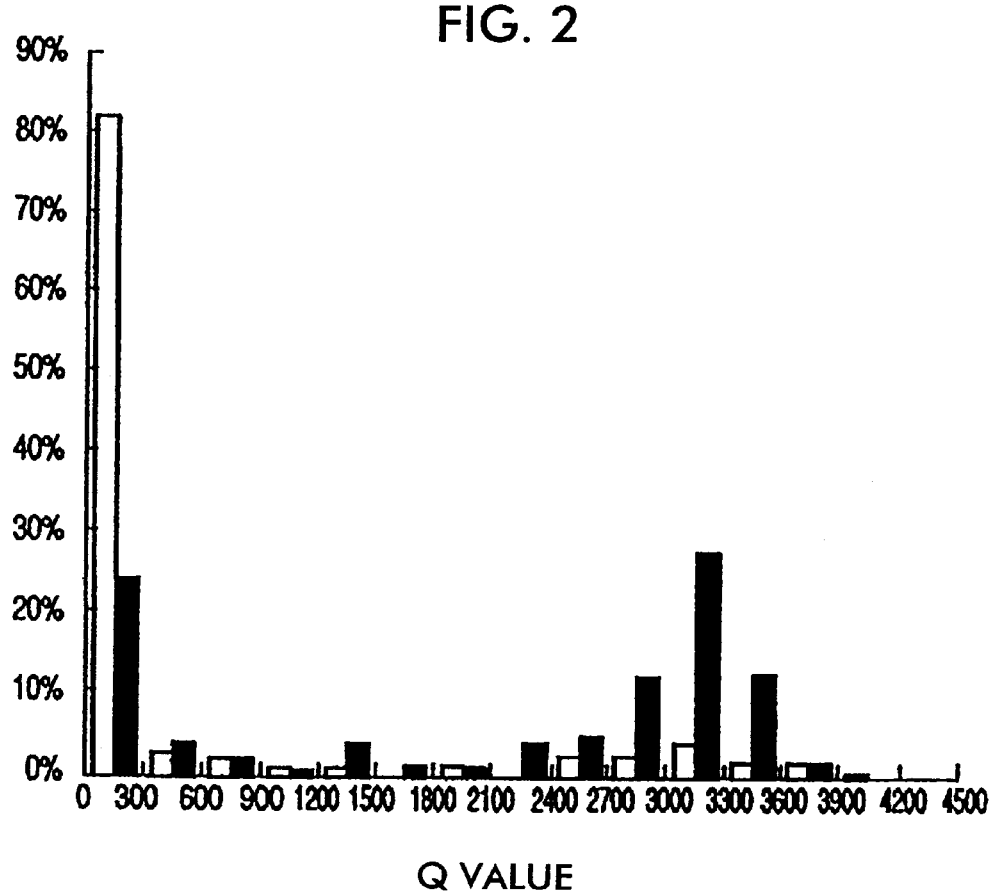
FIG. 2 is a graph showing the results of experiment made by the inventors.
Figure 3:
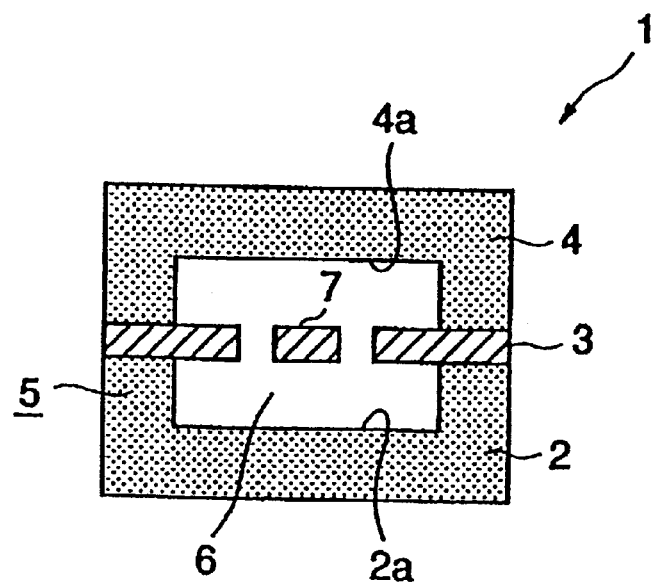
FIG. 3 illustrates the vacuum container.

FIG. 2 shows a distribution of the Q values of the vacuum containers 1, which is obtained when the vacuum containers 1 are grouped based on the Q values. In FIG. 2, the block-colored bar graph shows the distribution of the Q values of the vacuum containers 1 produced by the production process according to the first embodiment, and the blank bar graph shows that of the vacuum containers 1 produced by the conventional production process.

As seen in FIG. 2, the percentage by number of the vacuum containers 1 having a Q value of less than 300 is at least about 80% of the plurality of the vacuum containers produced by the conventional production process. On the other hand, the percentage by number of the vacuum containers 1 having a Q value of at least 2100 is at least about 60% of the plurality of the vacuum containers 1 produced by the production process according to the first embodiment. Thus, evidently, the Q value for resonance of the vibrator 7 contained in the vacuum container 1, which is produced by the production process according to the first embodiment, is considerably enhanced, and also, the vacuum condition is improved compared to those of the conventional example.

Thus, the experiment made by the inventors of the present invention has identified that the vacuum condition of the vacuum cavity 6 can be improved by forming the vacuum container 1 by the production process according to the first embodiment, compared to the vacuum container 1 produced by the conventional production process.

As described above, according to the first embodiment, the vacuum condition of the vacuum cavity 6 in the vacuum container 1 can be improved. Thus, when the vibrator 7 of the angular velocity sensor shown in FIG. 4 is contained inside the vacuum cavity 6, the Q value of the vibrator 7 is high, and the vibration condition is considerably improved as shown by the above-described experimental results. Thus, the sensitivity at which an angular velocity can be detected can be enhanced. In addition, the vibration conditions of the vibrators 7 in the vacuum containers 1 become almost the same, and scattering of the sensitivities of the angular velocity sensors can be suppressed to be very small. Thus, the reliability of the performance of the angular velocity sensor can be enhanced.

Moreover, according to the first embodiment, the vacuum condition of the vacuum cavity 6 can be enhanced without a gas adsorptive substance being disposed in the vacuum cavity 6 of the vacuum container 1. No labor and time for disposing gas adsorptive substances are required. The vacuum cavity 6 can be reduced in size correspondingly to no need of gas adsorptive substances.

Moreover, according to the first embodiment, the concavities 2a and 4a of the base 20 (base layer 2) and the lid material 22 (lid layer 4) are formed by sand blast working. Thus, the following advantages can be obtained. For example, if the bottoms of the respective concavities 2a and 4a formed in the base layer 2 and the lid layer 4 have smooth-surfaces, the vibrator will adhere to the bottom of the concavity 2a or 4a when the vibrator 5 comes into contact with the bottom of the concavity 2a or 4a, which may be caused by fall or the like of the vacuum container 1. As a result, the vibrator 7 can not be moved. Thus, the function of the angular velocity sensor cannot be achieved, and so forth.

Moreover, if the bottoms of the concavities 2a and 4a have smooth surfaces, the above-mentioned problem on adhesion of the vibrator 7 will occur during the production process in some cases. That is, the semiconductor substrate 21 is processed to form the vibrator 7 in the lifting state, as shown in FIG. 1D. Thereafter, the body of the base 20 and the semiconductor substrate 21 coupled to each other is rinsed and dried. In the rising process, liquid enters the gap between the bottom of the concavity 2a and the vibrator 7. In the succeeding drying process, the vibrator 7 is attracted toward the bottom side of the concavity 2a, due to the surface tension of the liquid while the liquid is evaporated off in the drying process. When the liquid is completely evaporated off and the drying is finished, the vibrator closely adheres to the bottom of the concavity 2a in some cases. Thus, the vibrator 7 can not be moved as described above.

On the other hand, according to the first embodiment, the concavities 2a and 4a are formed by sand blast working as described above. Accordingly, the bottoms of the concavities 2a and 4a have rough surfaces having a roughness R of 0.3 $\mu$m or more, respectively. Thereby, the vibrator 7 can be prevented from adhering to the bottom of the concavity 2a or 4a. Thus, adhesion of the vibrator 7 to the concavity 2a or 4a can be securely prevented.

Hereinafter, a second embodiment will be described. Especially, the second embodiment is different from the first embodiment in that anode-coupling in a spot pattern of the semiconductor substrate 21 to the lid material 22 as shown in FIG. 1E is carried out in the atmosphere. In other respects, the second embodiment is similar to the first embodiment. In the description of the second embodiment, similar parts in the first and second embodiments are designated by the same reference numerals, and the repeated description is omitted.

According to the second embodiment, the base 20 and the semiconductor substrate 21 are coupled to each other, and the semiconductor substrate 21 is processed. Thereafter, the lid material 22 is placed on the upper side of the semiconductor substrate 21 as shown in FIG. 1E. The semiconductor substrate 21 and the lid material 22 are anode-coupled to each other in a spot pattern. The anode-coupling is carried out in the atmosphere. After this, the whole anode-coupling of the semiconductor substrate 21 to the lid material 22 is carried out in a vacuum under vacuum-exhausting.

Also, when the anode-coupling in a spot pattern of the semiconductor substrate 21 to the lid material 22 is carried out in the atmosphere, the vacuum condition of the vacuum cavity 6 of the vacuum container 1 is also improved significantly, and scattering of the vacuum degree can be suppressed compared to that by the conventional production process, as well as in the first embodiment in which the anode-coupling in a spot pattern is carried out in a vacuum. This has been identified by the experiment made by the inventors of this invention.

In the second embodiment, the vacuum condition of the vacuum cavity 6 can be desirably improved, as well as in the first embodiment. Accordingly, advantageously, the reliability of the performances of the vacuum container 1 can be enhanced, time and labor necessary to provide a gas adsorptive substance can be excluded, the size of the vacuum container 1 can be reduced, and so forth.

The present invention is not limited onto the above-described embodiments. Various forms can be adopted. For example, in the above-described embodiments, the semiconductor substrate 21 and the lid material 22 are anode-coupled to each other in one position thereof. However, the anode-coupling may be made in plural positions thereof. That is, the number of anode-coupling sites is not restricted. Moreover, in the above-described embodiments, the position at which the semiconductor substrate 21 and the lid material 22 are anode-coupled to each other in a spot pattern lies in the ends thereof. The position for spot anode-coupling may be in the middle areas of the semiconductor substrate 21 and the lid material 22. Thus, the position is not restricted. As described above, the positions at which the spot electrode-coupling is carried out and moreover, the number of the positions are not restricted. The spot anode-coupling positions and the number of the positions are set so that none of the vacuum cavities 6 are air-tightly sealed by the anode-coupling in a spot pattern.

Moreover, in the above-described embodiments, the semiconductor substrate 21 and the lid material 22 are anode-coupled to each other in a spot pattern at one time, and thereafter, the semiconductor substrate 21 and the lid material 22 are wholly anode-coupled to each other. That is, the anode-coupling is achieved in the two steps. The spot anode coupling of the semiconductor substrate 21 to the lid material 22 may be carried out at plural times. For example, the semiconductor substrate 21 and the lid material 22 are anode-coupled to each other in at least three steps.

Moreover, in the above-described respective embodiments, the base 20 (base layer 2) and the lid material 22 (lid layer 4) are formed of glass substrates, respectively. The base 20 (base layer 2) and the lid material 22 (lid layer 4) may be made of any material excluding glass, provided that the material can be anode-coupled to the semiconductor substrate 20 (semiconductor layer 3). Moreover, the semiconductor substrate 20 (semiconductor layer 3) may be made of a semiconductor excluding silicon.

Furthermore, in the above-described respective embodiments, the concavities 2a and 4a are formed by sand blast working. The concavities 2a and 4a may be formed by another technique.

Moreover, in the above-described respective embodiments, the vibrator 7 (sensor unit 8) shown in FIG. 4 is contained inside the vacuum cavity 6 of the vacuum container 1 as an example. A member to be contained in the vacuum cavity 6 is not restricted onto the vibrator 7. Moreover, in the above-described respective embodiments, the concavities 2a and 4a are formed in the base layer 2 and the lid layer 4 to form the vacuum cavity 6. To produce the vacuum cavity 6, a gap between the base layer 2, the lid layer 4, and the semiconductor layer 3 may be formed by making the center area of the semiconductor layer 3 thinner than the ends thereof, for example, instead of forming the concavity in one or both of the base layer 2 and the lid layer 4.

According to the present invention, the semiconductor substrate is coupled to the upper side of the base, the lid material is placed on the upper side of the semiconductor substrate, and the semiconductor substrate and the lid material are anode-coupled to each other in a spot pattern. Thereafter, the semiconductor substrate and the lid material are wholly anode-coupled to each other to produce the vacuum container. Accordingly, the vacuum degree of the vacuum cavity in the vacuum container can be enhanced, and moreover, scattering of the vacuum degree of the vacuum cavities in the vacuum containers can be suppressed.

As described above, the vacuum degree of the vacuum cavity in the vacuum container can be enhanced without a gas adsorptive substance being disposed in the vacuum cavity. Accordingly, a gas adsorptive substance needs to be placed in the vacuum cavity, so that labor and time for providing a gas adsorptive substance can be omitted. Moreover, the size of the vacuum cavity can be reduced, and the vacuum container is reduced in size.

Also, according to the present invention, the body of the base and the semiconductor substrate coupled together, and the lid material are placed in the atmosphere, and the semiconductor substrate and the lid material are anode-coupled to each other in a spot pattern. Thereafter, the semiconductor substrate and the lid material are wholly anode-coupled in a vacuum. In this case, since the spot anode-coupling is carried out in the atmosphere, the body of the base and the semiconductor substrate coupled together and the lid material can be easily set for anode-coupling. The time required for the spot anode-coupling process can be reduced.

What is claimed is:

1. A method of producing a vacuum container which has a vacuum cavity formed inside a laminate including a base layer, a semiconductor layer, and a lid layer, comprising the steps:

coupling a semiconductor substrate to the upper side of a base;

anode-coupling a lid material to the upper side of the semiconductor substrate to form a laminate; and dividing and separating the laminate into predetermined individual areas;

the lid material being placed on the upper side of the semiconductor substrate after the semiconductor substrate is coupled to the base, the semiconductor substrate and the lid material being anode-coupled to each other in a spot pattern, and succeedingly, the semiconductor substrate and the lid material being entirely anode-coupled to each other.

2. A method of producing a vacuum container according to claim 1, wherein the body of the base and the semiconductor substrate coupled to each other and the lid material are arranged in the atmosphere, the semiconductor substrate and the lid material are anode-coupled to each other in a spot pattern, and succeedingly, the semiconductor substrate and the lid material are entirely anode-coupled to each other in a vacuum in which vacuum-exhausting is carried out.

* * * * *